(12) United States Patent
Lin et al.

(10) Patent No.: US 9,076,796 B2
(45) Date of Patent: Jul. 7, 2015

(54) INTERCONNECTION STRUCTURE FOR PACKAGE AND FABRICATION METHOD THEREOF

(71) Applicant: Siliconware Precision Industries Co., Ltd., Taichung (TW)

(72) Inventors: Chun-Hung Lin, Taichung Hsien (TW); Chun-Hung Lu, Taichung Hsien (TW); Guang-Hwa Ma, Taichung Hsien (TW); Hsiao-Chun Huang, Taichung Hsien (TW); Kuang-Hsin Chen, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 129 days.

(21) Appl. No.: 13/894,687

(22) Filed: May 15, 2013

(65) Prior Publication Data

US 2014/0217605 A1    Aug. 7, 2014

(30) Foreign Application Priority Data

Feb. 7, 2013    (TW) .............................. 102104743 A

(51) Int. Cl.
*H01L 23/532*        (2006.01)
*H01L 21/768*        (2006.01)
*H01L 23/498*        (2006.01)

(52) U.S. Cl.
CPC .... *H01L 23/53295* (2013.01); *H01L 21/76802* (2013.01); *H01L 23/49894* (2013.01); *H01L 23/53238* (2013.01); *H01L 23/5329* (2013.01); *H01L 2924/0002* (2013.01)

(58) Field of Classification Search
CPC ................... H01L 23/49822; H01L 23/49827; H01L 21/486; H01L 23/5226
USPC .......................................... 257/774; 438/623
See application file for complete search history.

(56) References Cited

U.S. PATENT DOCUMENTS 6,514,671 B1 *    2/2003    Parikh et al. ................... 430/313
6,740,579 B2 *    5/2004    Andideh ........................ 438/623

* cited by examiner

*Primary Examiner* — Roy Potter
(74) *Attorney, Agent, or Firm* — Mintz Levin Cohn Ferris Glovsky & Popeo, P.C.; Peter F. Corless; Steven M. Jensen

(57) ABSTRACT

An interconnection structure for a package is disclosed. The interconnection structure includes a substrate body having a conductive portion formed on a surface thereof; a first photosensitive dielectric layer formed on the surface of the substrate body and having a via for exposing the conductive potion; a conductive via formed in the via; a second photosensitive dielectric layer formed on the first photosensitive dielectric layer and having a opening for exposing the conductive via and a portion of the first photosensitive dielectric layer; and a conductive trace layer formed in the opening of the second photosensitive dielectric layer so as to be electrically connected to the conductive portion through the conductive via, thereby simplifying the fabrication process and reducing the fabrication cost and time.

35 Claims, 7 Drawing Sheets

INTERCONNECTION STRUCTURE FOR PACKAGE AND FABRICATION METHOD THEREOF

CROSS-REFERENCES TO RELATED APPLICATIONS

This application claims under 35 U.S.C. §119(a) the benefit of Taiwanese Application No. 102104743, filed Feb. 7, 2013, the entire contents of which is incorporated herein by reference.

BACKGROUND OF THE INVENTION

1. Field of the Invention

The present invention relates to interconnection structures of packages and fabrication methods thereof, and more particularly, to a low-cost interconnection structure having photosensitive and patternable dielectric layers and a fabrication method thereof.

2. Description of Related Art

Conventionally, a multi-layer conductive trace structure of an integrated circuit is formed by dry-etching a metal layer and then filling it with a dielectric layer. Alternatively, a damascene process may be used, which involves etching a dielectric layer to form a pattern and then filling the pattern with a metal material so as to form conductive traces. As such, the damascene process eliminates the need to etch a metal layer. If the metal layer is made of copper instead of aluminum, the damascene process is preferably used since dry etching of copper is difficult.

Generally, there are two kinds of damascene processes: single and dual. In a dual damascene process, both vias and conductive traces are formed at once through only one metal filling step. The dual damascene process has become increasingly important in semiconductor processes.

FIGS. 1A to 1I are schematic cross-sectional views illustrating a conventional dual damascene process.

Referring to FIG. 1A, a silicon substrate 10 is provided.

Referring to FIG. 1B, a first nitride layer 11, a first oxide layer 12, a second nitride layer 13 and a second oxide layer 14 are sequentially formed on a surface of the silicon substrate 10 by chemical vapor deposition (CVD).

Referring to FIG. 1C, a patterned first photoresist layer 15 is formed on the second oxide layer 14.

Referring to FIG. 1D, the second nitride layer 13 and the second oxide layer 14 are etched by using the first photoresist layer 15 as an etching mask.

Referring to FIG. 1E, the first photoresist layer 15 is removed.

Referring to FIG. 1F, a patterned second photoresist layer 16 is formed on the second oxide layer 14.

Referring to FIG. 1G, the first nitride layer 11 and the first oxide layer 12 are etched by using the second photoresist layer 16 as an etching mask, thereby forming vias 171 and grooves 172 in the first nitride layer 11, the first oxide layer 12, the second nitride layer 13 and the second oxide layer 14.

Referring to FIG. 1H, the second photoresist layer 16 is removed.

Referring to FIG. 1I, a metal layer 18 is deposited in the vias 171 and the grooves 172 and a portion of the metal layer 18 higher than the top surface of the second oxide layer 14 is removed so as to form conductive vias 181 and a conductive trace layer 182.

However, the above-described CVD, photoresist coating, exposure and development and dry etching steps are complicated, costly and time-consuming Particularly, the CVD and dry-etching steps are performed under a high vacuum environment in combination with special gases, thereby greatly increasing the process time and cost.

Therefore, there is a need to develop a technique for overcoming the above-described disadvantages.

SUMMARY OF THE INVENTION

In view of the above-described disadvantages, the present invention provides an interconnection structure for a package, which comprises: a substrate body having a conductive portion formed on a surface thereof; a first photosensitive dielectric layer formed on the surface of the substrate body and having a first opening for exposing the conductive portion; a first conductive trace layer formed in the first opening; a second photosensitive dielectric layer formed on the first photosensitive dielectric layer and the first conductive trace layer and having a via for exposing a portion of the first conductive trace layer; a conductive via formed in the via; a third photosensitive dielectric layer formed on the second photosensitive dielectric layer and having a second opening for exposing the conductive via and a portion of the second photosensitive dielectric layer; and a second conductive trace layer formed in the second opening so as to be electrically connected to the first conductive trace layer through the conductive via.

The present invention further provides a fabrication method of an interconnection structure for a package, which comprises the steps of: forming a first photosensitive dielectric layer on a surface of a substrate body having a conductive portion, and forming a first opening in the first photosensitive dielectric layer for exposing the conductive portion; forming a first conductive trace layer in the first opening; forming a second photosensitive dielectric layer on the first photosensitive dielectric layer and the first conductive trace layer, and forming a via in the second photosensitive dielectric layer for exposing a portion of the first conductive trace layer; forming a third photosensitive dielectric layer in the via and on the second photosensitive dielectric layer; removing a portion of the third photosensitive dielectric layer in the via and on the second photosensitive dielectric layer so as to form an opening that expose the via and a portion of the second photosensitive dielectric layer; and forming a conductive via in the via and forming a second conductive trace layer in the second opening such that the first conductive trace layer and the second conductive trace layer are electrically connected through the conductive via.

The present invention provides another interconnection structure for a package, which comprises: a substrate body having a conductive portion formed on a surface thereof; a first photosensitive dielectric layer formed on the surface of the substrate body and having a via for exposing the conductive potion; a conductive via formed in the via; a second photosensitive dielectric layer formed on the first photosensitive dielectric layer and having an opening for exposing the conductive via and a portion of the first photosensitive dielectric layer; and a conductive trace layer formed in the opening of the second photosensitive dielectric layer so as to be electrically connected to the conductive portion through the conductive via.

The present invention provides another fabrication method of an interconnection structure for a package, which comprises the steps of: forming a first photosensitive dielectric layer on a surface of a substrate body having a conductive portion, and forming a via in the first photosensitive dielectric layer for exposing the conductive portion; forming a second photosensitive dielectric layer in the via and on the first photosensitive dielectric layer; removing a portion of the second photosensitive dielectric layer in the via and on the first photosensitive dielectric layer so as to form an opening that expose the via and a portion of the first photosensitive dielectric layer; and forming a conductive via in the via and forming a conductive trace layer in the opening such that the conductive trace layer is electrically connected to the conductive portion through the conductive via.

Therefore, the present invention improves the conventional dual damascene process. By replacing the conventional chemical vapor deposited dielectric layers with photosensitive dielectric layers, the present invention dispenses with the dry-etching and CVD steps as required in the prior art, thereby simplifying the fabrication process and reducing the fabrication time and cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "first", "second", "a" etc. are merely for illustrative purposes and should not be construed to limit the scope of the present invention.

First Embodiment

FIGS. 2A to 2G are schematic cross-sectional views illustrating an interconnection structure for a package and a fabrication method thereof according to a first embodiment of the present invention.

Figure 1A:
FIGS. 1A to 1I are schematic cross-sectional views illustrating a conventional damascene process.
Figure 1B:
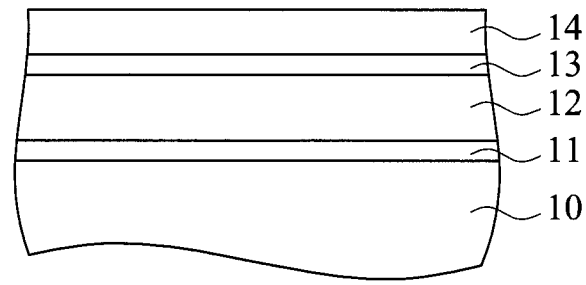
Figure 1C:
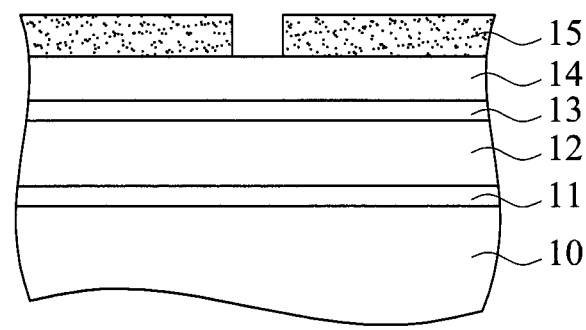
Figure 1D:
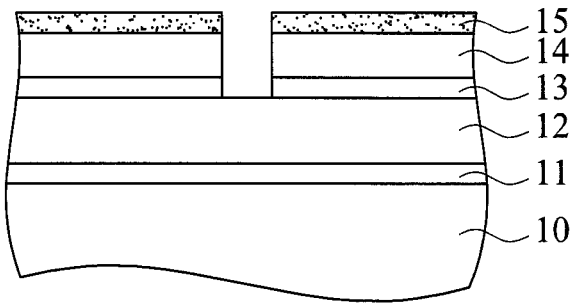
Figure 1E:
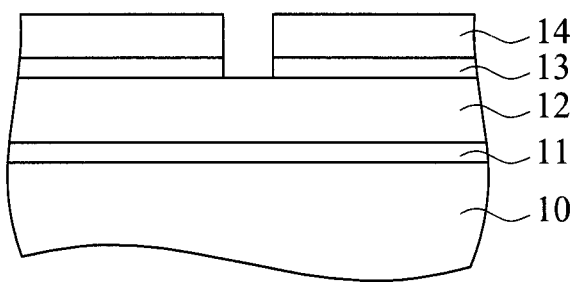
Figure 1F:
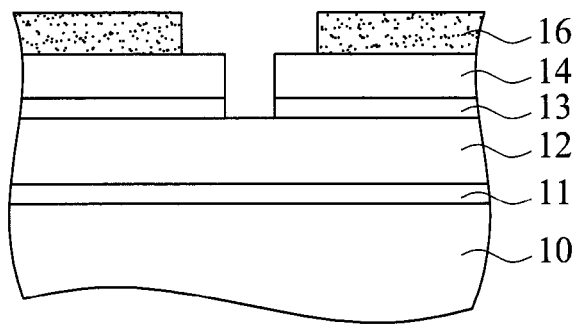
Figure 1G:
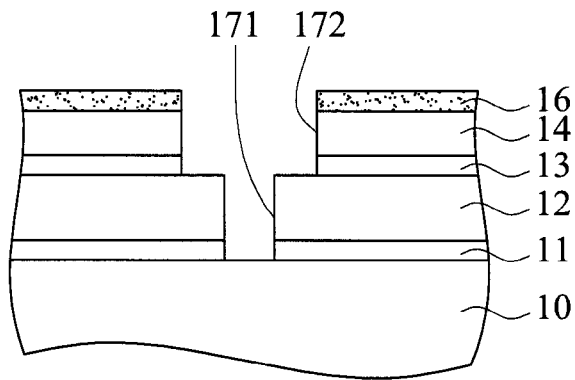
Figure 1H:
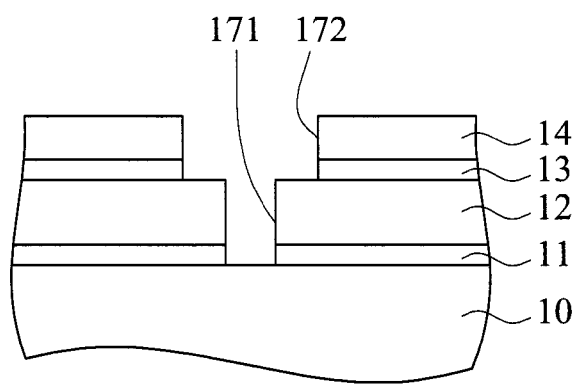
Figure 1I:
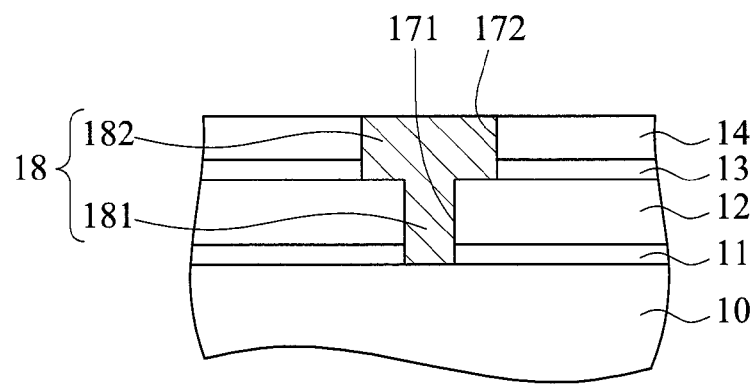
Figure 2A:
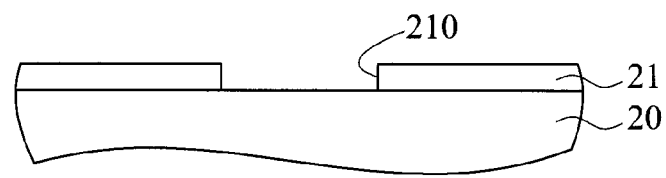
FIGS. 2A to 2G are schematic cross-sectional views illustrating an interconnection structure for a package and a fabrication method thereof according to a first embodiment of the present invention.

Referring to FIG. 2A, a first photosensitive dielectric layer 21 is formed on a surface of a substrate body 20 having a conductive portion (not shown), and a first opening 210 are formed in the first photosensitive dielectric layer 21 by lithography so as to expose the conductive portion. The first photosensitive dielectric layer 21 is then cured. The substrate body 20 can be a chip, a wafer or an interposer having conductive traces, or a dielectric layer having a plurality of conductive traces.

Figure 2B:
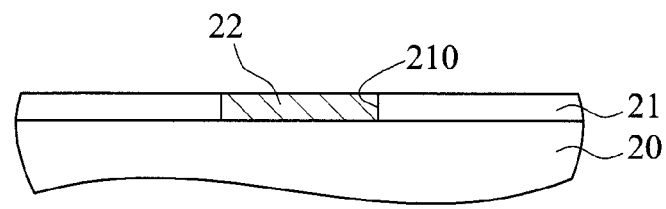

Referring to FIG. 2B, a first conductive trace layer 22 is formed in the first opening 210 by electroplating.

Figure 2C:
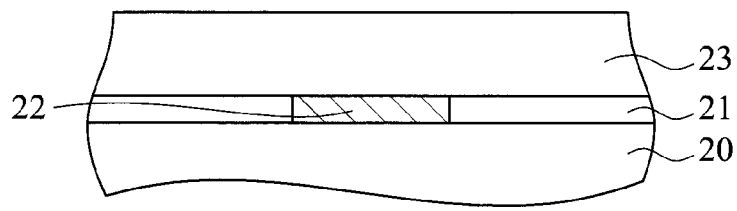

Referring to FIG. 2C, a second photosensitive dielectric layer 23 is formed on the first photosensitive dielectric layer 21 and the first conductive trace layer 22.

Figure 2D:
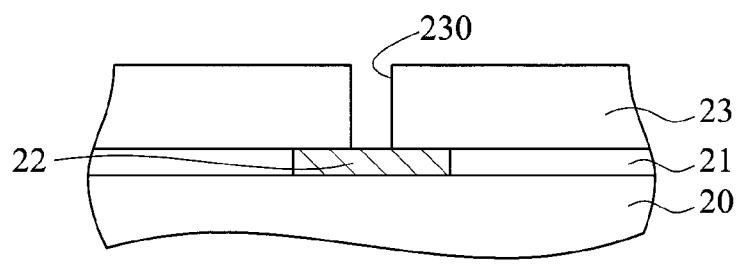

Referring to FIG. 2D, a via 230 are formed in the second photosensitive dielectric layer 23 by lithography so as to expose a portion of the first conductive trace layer 22, and then the second photosensitive dielectric layer 23 is cured.

Figure 2E:
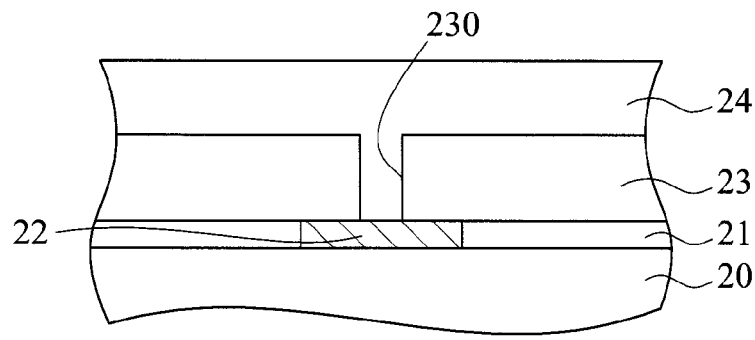

Referring to FIG. 2E, a third photosensitive dielectric layer 24 is formed in the via 230 and on the second photosensitive dielectric layer 23.

Figure 2F:
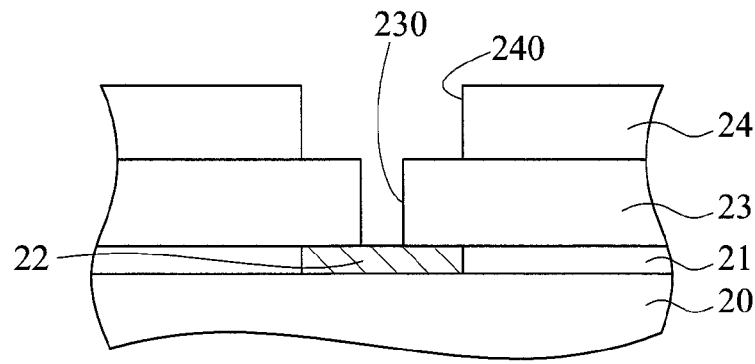

Referring to FIG. 2F, a portion of the third photosensitive dielectric layer 24 in the via 230 and on the second photosensitive dielectric layer 23 are removed by lithography so as to form a second opening 240 that expose the via 230 and a portion of the second photosensitive dielectric layer 23. Then, the third photosensitive dielectric layer 24 is cured.

Figure 2G:
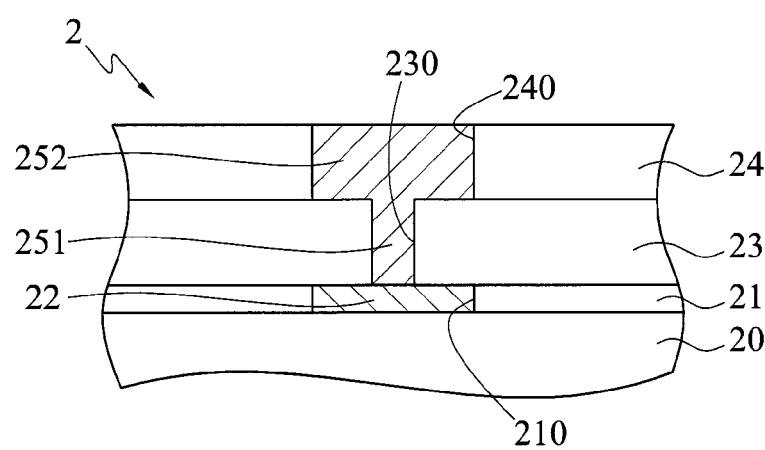

Referring to FIG. 2G, a conductive via 251 are formed in the via 230 by electroplating and a second conductive trace layer 252 is formed in the second opening 240 and electrically connected to the first conductive trace layer 22 through the conductive via 251, thus forming the interconnection structure 2 of the present invention.

In the present embodiment, the first, second and third photosensitive dielectric layers 21, 23, 24 are made of a photosensitive spin-on dielectric (PSOD) material, a photodefinable material or a photosensitive patternable material. For example, the photosensitive spin-on dielectric material mainly contains a photodefinable polybenzobisoxazole (PBO) precursor. The photodefinable material mainly contains a polyimide precursor. The photosensitive patternable material mainly contains a polysilsesquiazane composition. The first, second and third photosensitive dielectric layers 21, 23, 24 can be made of the same material or any two of them can be made of the same material. Alternatively, the three layers can be made of different materials.

Second Embodiment

FIGS. 3A to 3F are schematic cross-sectional views illustrating an interconnection structure for a package and a fabrication method thereof according to a second embodiment of the present invention.

Figure 3A:
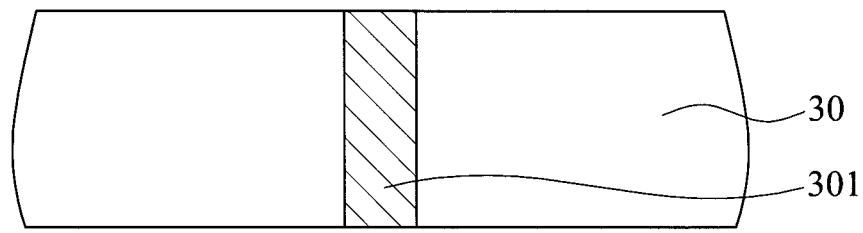
FIGS. 3A to 3F are schematic cross-sectional views illustrating an interconnection structure for a package and a fabrication method thereof according to a second embodiment of the present invention.

Referring to FIG. 3A, a substrate body 30 having a conductive portion such as conductive through holes 301 is provided. The substrate body 30 can be a chip, a wafer or an interposer having a plurality of conductive traces, or a dielectric layer having a plurality of conductive traces.

Figure 3B:
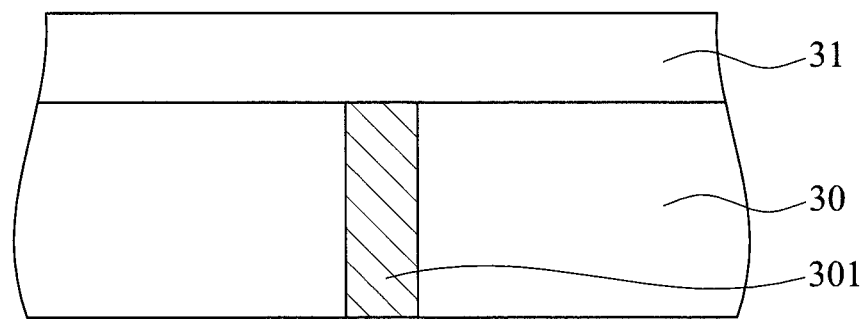

Referring to FIG. 3B, a first photosensitive dielectric layer 31 is formed on a surface of the substrate body 30 having the conductive portion.

Figure 3C:
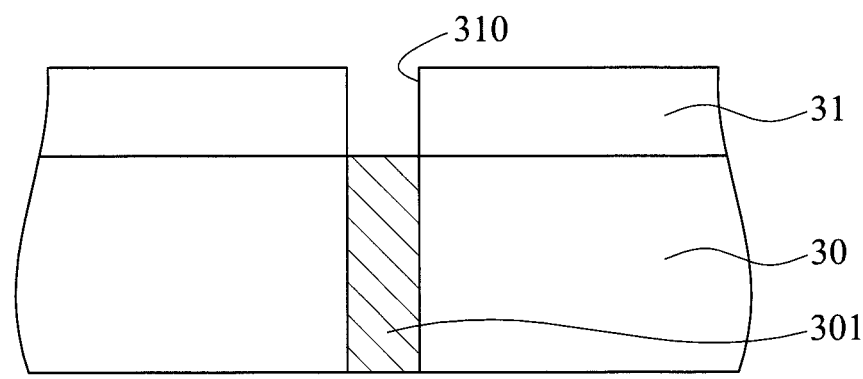

Referring to FIG. 3C, a via 310 is formed in the first photosensitive dielectric layer 31 by lithography so as to expose the conductive through holes 301 and then the first photosensitive dielectric layer 31 is cured.

Figure 3D:
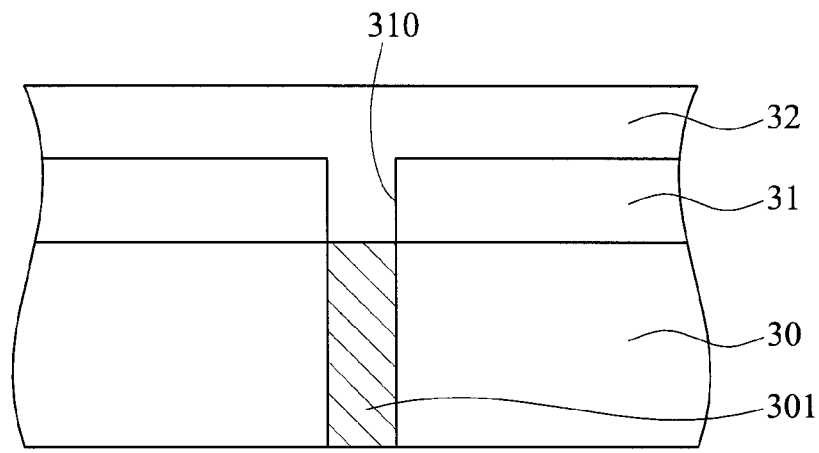

Referring to FIG. 3D, a second photosensitive dielectric layer 32 is formed in the via 310 and on the first photosensitive dielectric layer 31.

Figure 3E:
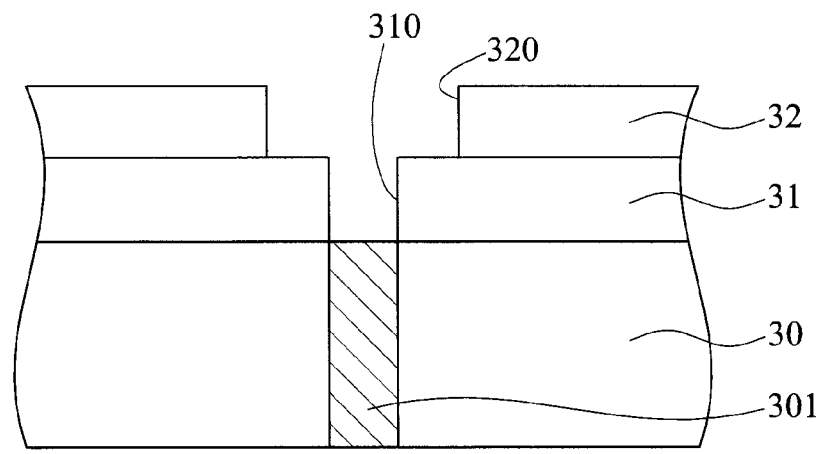

Referring to FIG. 3E, a portion of the second photosensitive dielectric layer 32 in the via 310 and on the first photosensitive dielectric layer 31 are removed to form an opening 320 that expose the via 310 and a portion of the first photosensitive dielectric layer 31. Then, the second photosensitive dielectric layer 32 is cured.

Figure 3F:
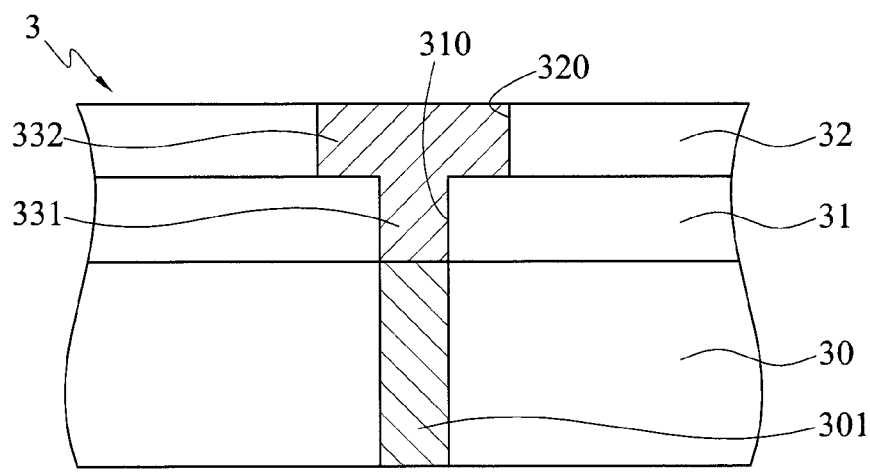

Referring to FIG. 3F, a conductive via 331 are formed in the via 310 and a conductive trace layer 332 is formed in the opening 320 and electrically connected to the conductive through holes 301 through the conductive via 331, thus forming the interconnection structure 3 of the present invention.

In the present embodiment, the first and second photosensitive dielectric layers 31, 32 are made of a photosensitive spin-on dielectric (PSOD) material, a photodefinable material or a photosensitive patternable material. For example, the photosensitive spin-on dielectric material mainly contains a photodefinable polybenzobisoxazole (PBO) precursor. The photodefinable material mainly contains a polyimide precursor. The photosensitive patternable material mainly contains a polysilsesquiazane composition. The first and second photosensitive dielectric layers 31, 32 can be made of the same material or different materials.

In the present invention, a chemical mechanical polishing (CMP) process can be performed after a conductive trace layer is formed. Since such a process can be easily understood by those skilled in the art, detailed description thereof is omitted herein.

The method of forming a conductive trace layer or a conductive via includes the steps of: forming a conductive layer in the opening or via by sputtering, wherein the conductive layer serves as a seed layer and is made of such as Ti/Cu, Ni/Cu or Au/Ni/Cu; and forming copper on the conductive layer by electroplating. Such a method can be easily understood by those skilled in the art and detailed description thereof is omitted herein.

The invention further provides an interconnection structure 2 for a package, which has: a substrate body 20 having a conductive portion (not shown) formed on a surface thereof; a first photosensitive dielectric layer 21 formed on the surface of the substrate body 20 and having a first opening 210 for exposing the conductive portion; a first conductive trace layer 22 formed in the first opening 210; a second photosensitive dielectric layer 23 formed on the first photosensitive dielectric layer 21 and the first conductive trace layer 22 and having a via 230 for exposing a portion of the first conductive trace layer 22; a conductive via 251 formed in the via 230; a third photosensitive dielectric layer 24 formed on the second photosensitive dielectric layer 23 and having a second opening 240 for exposing the conductive via 251 and a portion of the second photosensitive dielectric layer 23; and a second conductive trace layer 252 formed in the second opening 240 and connected to the first conductive trace layer 22 through the conductive via 251.

The invention provides another interconnection structure 3 for a package, which has: a substrate body 30 having a conductive portion formed on a surface thereof, wherein the conductive portion are such as conductive through holes 301; a first photosensitive dielectric layer 31 formed on the surface of the substrate body 30 and having a via 310 for exposing the conductive portion 301; a conductive via 331 formed in the via 310; a second photosensitive dielectric layer 32 formed on the first photosensitive dielectric layer 31 and having a corresponding opening 320 for exposing the conductive via 331 and a portion of the first photosensitive dielectric layer 31; and a conductive trace layer 332 formed in the opening 320 and electrically connected to the conductive portion 301 through the conductive via 331.

In the interconnection structures 2, 3, the first photosensitive dielectric layer 21, 31, the second photosensitive dielectric layer 23, 32 and the third photosensitive dielectric layer 24 are made of a photosensitive spin-on dielectric (PSOD) material, a photodefinable material or a photosensitive patternable material. For example, the photosensitive spin-on dielectric material mainly contains a photodefinable polybenzobisoxazole (PBO) precursor. The photodefinable material mainly contains a polyimide precursor. The photosensitive patternable material mainly contains a polysilsesquiazane composition.

The conductive via 251, 331 can have, but not limited to, a circular shape or a rectangular shape.

A built-up layer can further be formed on the interconnection structure of the present invention in the same manner as described above. The built-up layer formed on the second photosensitive dielectric layer and the first conductive trace layer, wherein the built-up layer comprises at least a first built-up photosensitive dielectric layer formed on the photosensitive dielectric layer underneath; a second built-up photosensitive dielectric layer formed on the first built-up photosensitive dielectric layer; a plurality of built-up conductive vias formed in the first built-up photosensitive dielectric layer; and a built-up conductive trace layer formed in second built-up photosensitive dielectric layer electrically connected to the built-up conductive vias.

An i-line, g-line or e-beam lithography can be performed to the photosensitive dielectric layers of the present invention. The photosensitive dielectric layers can be patterned, spin-on coated, developed and cured. The photosensitive dielectric layers can be obtained from such as AZ Electronic Materials, Asahi Kasei Corporation, Arch Specialty Chemicals, FUJIFILM Electronic Materials or TOK.

Therefore, the present invention improves the conventional dual damascene process. By replacing the conventional chemical vapor deposited dielectric layers with photosensitive dielectric layers, the present invention dispenses with the dry-etching and CVD steps as required in the prior art, thereby simplifying the fabrication process and reducing the fabrication time and cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An interconnection structure for a package, comprising:
   a substrate body having a conductive portion formed on a surface thereof;
   a first photosensitive dielectric layer formed on the surface of the substrate body and having a plurality of first openings exposing a part of the conductive portion;
   a first conductive trace layer formed in the first openings;
   a second photosensitive dielectric layer formed on the first photosensitive dielectric layer and the first conductive trace layer and having a plurality of vias for exposing a portion of the first conductive trace layer;
   a plurality of first conductive vias each formed in a corresponding one of the vias and electrically connected to the first conductive trace layer;
   a third photosensitive dielectric layer formed on the second photosensitive dielectric layer and having a plurality of second openings for exposing the first conductive vias and a portion of the second photosensitive dielectric layer; and
   a second conductive trace layer formed in the second openings and electrically connected to the first conductive trace layer through the first conductive vias.

2. The structure of claim 1, wherein the first, second and third photosensitive dielectric layers are made of a photosensitive spin-on dielectric material, a photodefinable material or a photosensitive patternable material.

3. The structure of claim 2, wherein the photosensitive spin-on dielectric material mainly comprises a photodefinable polybenzobisoxazole (PBO) precursor, the photodefinable material mainly comprises a polyimide precursor, and the photosensitive patternable material mainly comprises a polysilsesquiazane composition.

4. The structure of claim 1, wherein the first, second and third photosensitive dielectric layers are all made of same material, any two of three layers are made of same material, or the three layers are made of different materials.

5. The structure of claim 1, wherein the substrate body is a chip, a wafer or an interposer having a plurality of conductive traces, or a dielectric layer having a plurality of conductive parts.

6. The structure of claim 1, wherein the conductive portion includes a plurality of conductive parts.

7. The structure of claim 1, further comprising a built-up layer formed on the third photosensitive dielectric layer and the second conductive trace layer, wherein the built-up layer comprises at least a first built-up photosensitive dielectric layer formed on the third photosensitive dielectric layer; a second built-up photosensitive dielectric layer formed on the first built-up photosensitive dielectric layer; a plurality of built-up conductive vias formed in the first built-up photosensitive dielectric layer; and a built-up conductive trace layer formed in the second built-up photosensitive dielectric layer electrically connected to the built-up conductive vias.

8. A fabrication method of an interconnection structure for a package, comprising the steps of:
    forming a first photosensitive dielectric layer on a surface of a substrate body having a conductive portion, and forming a plurality of first openings in the first photosensitive dielectric layer exposing a part of the conductive portion;
    forming a first conductive trace layer in the first openings;
    forming a second photosensitive dielectric layer on the first photosensitive dielectric layer and the first conductive trace layer, and forming a plurality of vias in the second photosensitive dielectric layer for exposing a portion of the first conductive trace layer;
    forming a third photosensitive dielectric layer in the vias and on the second photosensitive dielectric layer;
    removing a portion of the third photosensitive dielectric layer in the vias and on the second photosensitive dielectric layer so as to form a plurality of second openings that expose the vias and a portion of the second photosensitive dielectric layer; and
    forming first conductive via in the vias and forming a second conductive trace layer in the second opening such that the first conductive trace layer and the second conductive trace layer are electrically connected through the first conductive via.

9. The method of claim 8, wherein the first openings, the vias, and the second openings are formed by lithography.

10. The method of claim 8, after forming the first opening in the first photosensitive dielectric layer, further comprising curing the first photosensitive dielectric layer.

11. The method of claim 8, after forming the vias in the second photosensitive dielectric layer, further comprising curing the second photosensitive dielectric layer.

12. The method of claim 8, after forming the second opening in the third photosensitive dielectric layer, further comprising curing the third photosensitive dielectric layer.

13. The method of claim 8, wherein the first, second and third photosensitive dielectric layers are made of a photosensitive spin-on dielectric material, a photodefinable material or a photosensitive patternable material.

14. The method of claim 13, wherein the photosensitive spin-on dielectric material mainly comprises a photodefinable polybenzobisoxazole (PBO) precursor, the photodefinable material mainly comprises a polyimide precursor, and the photosensitive patternable material mainly comprises a polysilsesquiazane composition.

15. The method of claim 8, wherein the first, second and third photosensitive dielectric layers are all made of same material, any two of three layers are made of same material, or the three layers are made of different materials.

16. The method of claim 8, wherein the substrate body is a chip, a wafer or an interposer having a plurality of conductive traces, or a dielectric layer having a plurality of conductive traces.

17. The method of claim 8, wherein the conductive portion includes a plurality of conductive parts.

18. The method of claim 8, further comprising forming a built-up layer on the third photosensitive dielectric layer and the second conductive trace layer, wherein the built-up layer comprises at least a first built-up photosensitive dielectric layer formed on the third photosensitive dielectric layer; a second built-up photosensitive dielectric layer formed on the first built-up photosensitive dielectric layer; a plurality of built-up conductive vias formed in the first built-up photosensitive dielectric layer; and a built-up conductive trace layer formed in second built-up photosensitive dielectric layer electrically connected to the built-up conductive vias.

19. An interconnection structure for a package, comprising:
    a substrate body having a conductive portion formed on a surface thereof, wherein the conductive portion is a conductive through hole;
    a first photosensitive dielectric layer formed on the surface of the substrate body and having a via exposing the conductive portion;
    a first conductive via formed in the via;
    a second photosensitive dielectric layer formed on the first photosensitive dielectric layer and having an opening for exposing the first conductive via and a portion of the first photosensitive dielectric layer; and
    a first conductive trace layer formed in the opening of the second photosensitive dielectric layer so as to be electrically connected to the conductive portion through the first conductive via.

20. The structure of claim 19, wherein the first and second photosensitive dielectric layers are made of a photosensitive spin-on dielectric material, a photodefinable material or a photosensitive patternable material.

21. The structure of claim 20, wherein the photosensitive spin-on dielectric material mainly comprises a photodefinable polybenzobisoxazole (PBO) precursor, the photodefinable material mainly comprises a polyimide precursor, and the photosensitive patternable material mainly comprises a polysilsesquiazane composition.

22. The structure of claim 19, wherein the first and second photosensitive dielectric layers are made of same material or different materials.

23. The structure of claim 19, wherein the substrate body is a chip, a wafer or an interposer having a plurality of conductive traces, or a dielectric layer having a plurality of conductive parts.

24. The structure of claim 19, wherein the conductive portion includes a plurality of conductive parts.

25. The structure of claim 24, further comprising a built-up layer formed on the second photosensitive dielectric layer and the first conductive trace layer, wherein the built-up layer comprises at least a first built-up photosensitive dielectric layer formed on the photosensitive dielectric layer; a second built-up photosensitive dielectric layer formed on the first built-up photosensitive dielectric layer; a plurality of built-up conductive vias formed in the first built-up photosensitive dielectric layer; and a built-up conductive trace layer formed in second built-up photosensitive dielectric layer electrically connected to the built-up conductive vias.

26. A fabrication method of an interconnection structure for a package, comprising the steps of:

forming a first photosensitive dielectric layer on a surface of a substrate body having a conductive portion, and forming a via in the first photosensitive dielectric layer for exposing the conductive portion;

forming a second photosensitive dielectric layer in the via and on the first photosensitive dielectric layer;

removing a portion of the second photosensitive dielectric layer in the via and on the first photosensitive dielectric layer so as to form an opening that exposes the via and a portion of the first photosensitive dielectric layer; and forming a first conductive via in the via and forming a first conductive trace layer in the opening such that the first corresponding conductive trace layer is electrically connected to the conductive portion through the first conductive via.

27. The method of claim 26, wherein the via and the opening are formed by lithography.

28. The method of claim 26, after forming the via in the first photosensitive dielectric layer, further comprising curing the first photosensitive dielectric layer.

29. The method of claim 26, after forming the opening in the second photosensitive dielectric layer, further comprising curing the second photosensitive dielectric layer.

30. The method of claim 26, wherein the first and second photosensitive dielectric layers are made of a photosensitive spin-on dielectric material, a photodefinable material or a photosensitive patternable material.

31. The method of claim 30, wherein the photosensitive spin-on dielectric material mainly comprises a photodefinable polybenzobisoxazole (PBO) precursor, the photodefinable material mainly comprises a polyimide precursor, and the photosensitive patternable material mainly comprises a polysilsesquiazane composition.

32. The method of claim 26, wherein the first and second photosensitive dielectric layers are made of same material or different materials.

33. The method of claim 26, wherein the substrate body is a chip, a wafer or an interposer having a plurality of conductive traces, or a dielectric layer having a plurality of conductive traces.

34. The method of claim 26, wherein the conductive portion includes a plurality of conductive parts.

35. The method of claim 26, further comprising forming a built-up layer on the second photosensitive dielectric layer and the first conductive trace layer, wherein the built-up layer at least comprises a first built-up photosensitive dielectric layer formed on the second photosensitive dielectric layer; a second built-up photosensitive dielectric layer formed on the first built-up photosensitive dielectric layer; a plurality of built-up conductive vias formed in the first built-up photosensitive dielectric layer; and a built-up conductive trace layer formed in the second built-up photosensitive dielectric layer electrically connected to the built-up conductive vias.

* * * * *